United States Patent

Havens et al.

[11] Patent Number: 5,900,792
[45] Date of Patent: May 4, 1999

[54] MAGNETIC FIELD HOMOGENEITY CORRECTION FOR SUPERCONDUCTING MAGNET

[75] Inventors: Timothy J. Havens, Florence, S.C.; Yulan Tan, Marlboro, N.J.

[73] Assignee: General Electric Company, Milwaukee, Wis.

[21] Appl. No.: 08/931,704

[22] Filed: Sep. 16, 1997

[51] Int. Cl.[6] .................................................. H01F 7/22

[52] U.S. Cl. .......................... 335/216; 335/299; 324/319; 324/320

[58] Field of Search ................................ 335/216, 299, 335/301; 324/318, 319, 320; 600/415, 421, 422, 423

[56] References Cited

U.S. PATENT DOCUMENTS

| 4,931,759 | 6/1990 | Breneman et al. | 335/301 |
| 5,291,169 | 3/1994 | Ige et al. | 335/216 |
| 5,329,266 | 7/1994 | Soeldner et al. | 335/216 |
| 5,389,909 | 2/1995 | Havens | 335/216 |
| 5,485,088 | 1/1996 | Westphal et al. | 324/320 |

*Primary Examiner*—Michael L. Gellner
*Assistant Examiner*—Raymond Barrera
*Attorney, Agent, or Firm*—Irving M. Freedman; Christian G. Cabou; Phyllis Y. Price

[57] ABSTRACT

Magnetic field homogeneity correction system including coils for a superconducting magnet assembly are wound on the same coil forms as the axially spaced main magnet coils such that they are superimposed radially to simplify the system including design requirements for associated passive shimming and reduce transverse magnetic forces therebetween, and improve magnetic field homogeneity.

11 Claims, 1 Drawing Sheet

MAGNETIC FIELD HOMOGENEITY CORRECTION FOR SUPERCONDUCTING MAGNET

BACKGROUND OF INVENTION

This invention relates to superconducting magnet assembly for a magnetic resonance imaging system (hereinafter called "MRI"), and more particularly to an improved and simplified arrangement for improving magnetic field homogeneity in such an assembly.

As is well known, a superconducting magnet can be made superconducting by placing it in an extremely cold environment, such as by enclosing it in a cryostat or pressure vessel containing liquid helium or other cryogen. The extreme cold ensures that the magnet coils are made superconducting, such that when a power source is initially connected to the coil (for a period, for example, of up to one hour) to introduce a current flow through the coils, the current will continue to flow through the coils even after power is removed due to the absence of resistance, thereby maintaining a strong magnetic field. Superconducting magnets find wide application in the field of MRI.

However, MRI requires very strong or large magnetic fields in the imaging bore with a very high degree of uniformity or homogeneity. Typically this homogeneity requirement, on the order of 10 parts per million (ppm) on 40 to 50 cm diameter spherical volume (DSV), cannot be achieved by controlling manufacturing tolerances. In practice shim systems which may be extra coils, typically called correction coils, small pieces of iron, typically called passive shims, or some combination of the two are provided to correct or improve the magnetic field homogeneity. This shim system allows reasonable manufacturing tolerances. Typical magnet homogeneities after magnet manufacture are on the order of a few hundred ppm. Use of such shim systems can reduce this homogeneity to the required 10–15 ppm.

Considerable effort has been directed at systems which provide the required homogeneity yet which are uncomplex in structure and adjustment. Current correction coil designs utilize correction coil formers or supports, typically of fiber reinforced epoxy plastic (FRP) material. Wire coils are wound on the correction coil former with the correction coil system consisting of a plurality of correction coils added to the interior of the superconducting magnet assembly. These correction coils are typically designed to create single harmonics as purely as possible. One axial correction coil system has 14 coils to create or provide "6 orders of shim". In addition, a transverse correction coil system is typically added to the shim system. Such systems are complex and costly and require considerable space in the MRI magnet assembly.

Current passive shim systems also utilize another FRP drum that is inserted in the warm space inside the magnet bore. Shims or pieces of magnetic material are mounted on drawers that slide into slots on the drum. The drawers must be removed and reinserted into the drum while the magnet is at field (in superconducting operation). However, the strong magnetic field created by the superconducting main magnet coils exert forces on the drawers and on the internal correction coils. In the case of, for example, a 1.5 Tesla magnet these forces can be very large. In addition, as the ambient temperature surrounding the passive shims increases, the homogeneity of the magnet is degraded. Minimizing the total amount of shim will reduce this undesirable effect.

One design of such shim drums is shown in U.S. Pat. No. 5,389,909 of Timothy J. Havens, entitled "Open Architecture Magnetic Resonance Imaging Passively Shimmed Superconducting Magnet Assembly", which is assigned to the same assignee as the present invention.

Such existing shimming systems tend to be relatively complex, costly and difficult and time consuming to adjust to obtain the required field homogeneity. The structure provided to support the shims must be mechanically strong enough and rigid enough to resist the strong magnetic forces exerted on the shimming structures by the strong main magnetic field. In addition, such support structures add complexity and weight to the superconducting magnet. Still further, passive correction systems tend to be large and transverse correction coils are costly such that a more efficient overall field homogeneity system also lowers cost and size.

OBJECTS AND SUMMARY OF INVENTION

It is an object of the present invention to provide an improved superconducting magnet coil assembly for an MRI magnet which provides desired field homogeneity with a simplified shimming system.

It is another object of the present invention to provide an improved superconducting magnet coil assembly in which inhomogeneities in the magnetic field are minimized while minimizing magnet cost and the effect of magnetic forces, and simplifying shimming complexity.

It is a further object of the present invention to provide an uncomplex shimming arrangement in an MRI magnet which minimizes the magnetic forces on the shimming arrangement, minimizes temperature dependence of homogeneity, and simplifies attaining magnetic field homogeneity.

In accordance with one form of the invention, a magnetic resonance imaging superconducting magnet includes a plurality of main magnet coil assemblies positioned on coil support forms within a cryogen vessel and axially spaced along the axis of the cryogen vessel. Each of the plurality of coil support forms includes pockets to support the main magnet coil which develops the strong magnetic field along the magnet axis and within the imaging bore formed by the cryogen vessel, and also includes means to support a shimming correction coil on the same form with the two coils superimposed upon one another and supported by the same coil form. The main magnet and correction coils are radially displaced with the correction coils improving magnetic field homogeneity within the axial bore and correcting for axial or radial displacement of the main magnetic coils which occurs due to normal manufacturing tolerances during manufacture and assembly of the superconducting magnet. The coil form is molded FRP with the main magnet coil extending axially approximately 1 to 1.5 times the axial length of its associated correction coil.

DETAILED DESCRIPTION OF PREFERRED EMBODIMENT OF INVENTION

Figure 1:
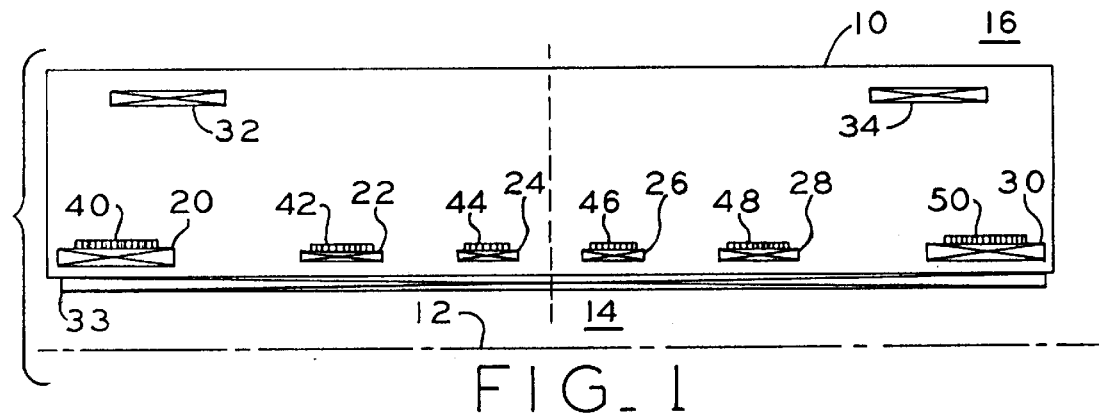
FIG. 1 is a simplified cross-sectional view showing a superconducting magnet assembly in accordance with the invention.
Figure 3:
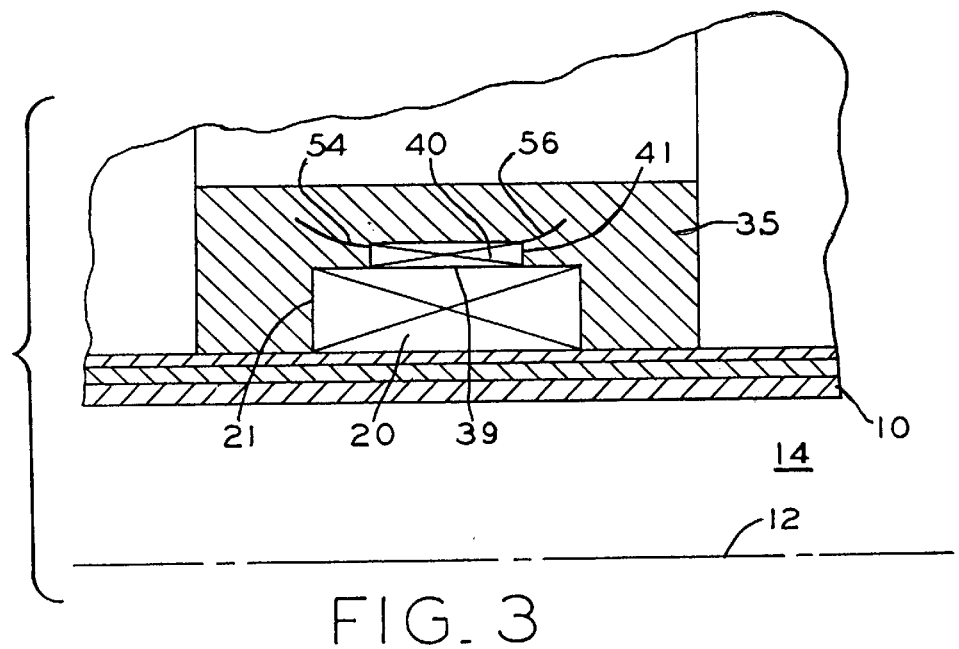
FIG. 3 is an enlarged cross-sectional view showing details of the coil form of FIG. 1 which supports the main and correction coils.

Referring first to FIGS. 1 and 3, a cryogen or helium pressure vessel 10 extends along and around axis 12 of imaging bore 14 formed within the helium vessel of superconducting magnet 16. A plurality of main magnet coils 20, 22, 24, 26, 28 and 30 are positioned within helium vessel 10 contiguous to and surrounding imaging bore 14, and axially spaced along axis 12. As is common in magnetic resonance imaging, the axial length of main magnet coils 20, 22, 24; and of 26, 28, and 30, respectively, are different. One or more shielding coils such as those shown by 32 and 34 are included within helium vessel 10 to reduce the magnetic stray field and minimize siting and installation costs.

However, normal manufacturing tolerances in the axial and radial positioning of main magnet coils 20, 22, 24, 26, 28, 30, 32 and 34 result in inhomogeneities of the magnetic field produced within imaging bore 14 which must be reduced in order to provide the desired imaging quality of the MRI equipment in which superconducting magnet 16 is incorporated. One or more shim drawers, shown generally as 33, utilizing ferromagnetic members in accordance with the aforementioned U.S. Pat. No. 5,389,909 are provided to enable adjustment and improvement of the magnetic field homogeneity within imaging bore 14.

However, a need remains to further compensate for manufacturing tolerances and hence variations, for example, in the axial and radial positioning of main magnet coils 20, 22, 24, 26, 28 and 30, each of which are wound in a support or pocket 21 molded within FRP coil form 35. Also molded within coil form 35 is a support means or pocket 41 to receive a correction coil 40 such that the main magnet coils such as coil 20 and their associated correction coil such as coil 40 are superimposed, concentric, and radially displaced about axis 12 of imaging bore 14.

As shown in FIG. 1, correction coils 40, 42, 44, 46, 48 and 50 are each associated with a main magnet coil 20, 22, 24, 26, 28 and 30, respectively. The coils pairs such as correction coil 41 and main magnet coil 21 need only be separated by insulating tape 39 enabling them to be wound consecutively within pockets 41 and 21, respectively formed within coil form 35. Electrical leads such as 54 and 56 for the coils are brought outside helium vessel 10 to enable a desired current flow to be provided prior to commencing superconducting operation of superconducting magnet 16.

It is to be noted that the correction coils such as 41 need not be displaced axially from main magnet coil such as 21 such that the correction coils not only do not require their own coil form and structure, the axial forces that would otherwise be exerted against the correction coils by the main magnet coils are minimized and, more important, a correction coil such as 41 is in close proximity to the main magnet coil such as 21 for which it is providing magnetic field compensation or correction. The correction coils such as 41 are optimally placed for correction of the axial or radial displacement of the main magnet coils such as 21 and hence are in close proximity to the source of the error. It is not necessary in some installations to include a correction coil, such as 41, in association with all of the main magnet coils, such as 21. It is possible to eliminate some of the correction coils 40, 42, 44, 46, 48 and 50. The current flow through each of correction coils 40, 42, 44, 46, 48, and 15 is adjusted to provide the degree of magnetic field homogeneity correction provided by that coil as is common in the art for correction coils.

It has been found that such a simplified correction coil arrangement when coupled with a passive shim system such as that shown in simplified form by magnetic shim 33 are sufficient to reduce magnetic forces on the shim drawers to an acceptable level and to provide acceptable levels of magnetic fields homogeneity within imaging bore 14. Complexity and cost of the overall system is reduced.

Figure 2:
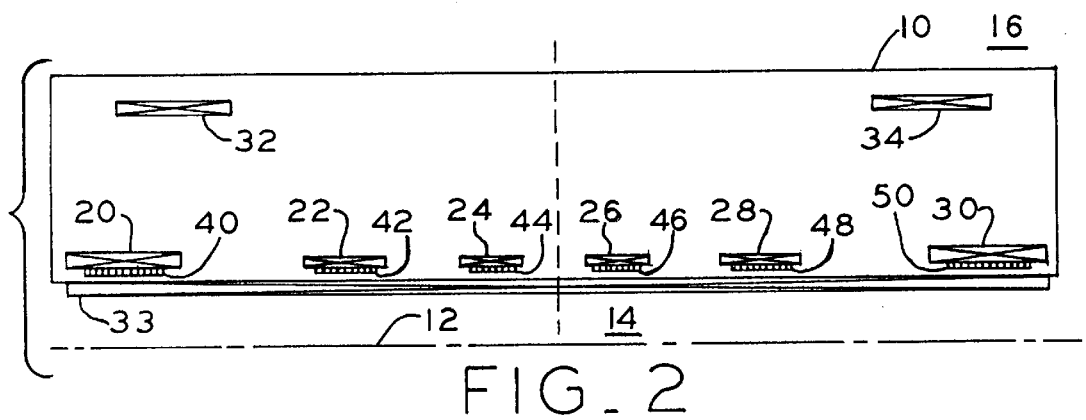
FIG. 2 is an arrangement in which the radial positioning of the main magnet and correction coils relative to the axis of the superconducting magnet is reversed.

FIG. 2 shows an arrangement in which correction coils 40, 42, 44, 46, 48 and 50 are positioned closer to imaging bore 14 than the main magnet coils 20, 22, 24, 26, 28 and 30.

In one embodiment of the invention, the axial length of main magnet coils 20, 22 and 24, and 30, 28, and 26, respectively, extend axially approximately 1 to 1.5 times that of the correction coils 40, 42, 44, 46, 48 and 50.

While only certain features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. In a magnetic resonance imaging superconducting magnet assembly forming an axial imaging bore to receive patients, an assembly to improve magnetic field homogeneity within the bore comprising:

a cryogen vessel surrounding said axial bore;

a plurality of coil support forms positioned about, and spaced along, said axial bore;

each of said coil supports including a main magnet coil to produce said magnetic field and a secondary correction coil radially concentric with and contiguous to said main magnet coil to minimize the inhomogeneity of said magnetic field, within said bore while minimizing axial forces between said coils;

said coil support including a plurality of axially spaced pockets to provide support against axial movement of both the main magnet coil and the secondary correction coil positioned within each said pocket.

2. The superconducting magnet of claim 1 wherein at least some of said coil support forms include a T-shaped first and second radially spaced coil support means in which said main magnet coil and said correction coil are positioned, respectively, in a layered continuous relationship.

3. The superconducting magnet of claim 2 in which said correction coils are radially closer to said axis than said main magnet coils.

4. The superconducting magnet of claim 2 in which said main magnet coils are radially closer to said axis than said correction coils.

5. In a magnetic resonance imaging superconducting magnet assembly forming an axial imaging bore to receive patients, an assembly to improve magnetic field homogeneity within the bore comprising:

a cryogen vessel surrounding said axial bore;

a plurality of coil support forms positioned about, and spaced along, said axial bore;

each of said coil supports including a main magnet coil to produce said magnetic field and a secondary correction coil radially concentric with and contiguous to said main magnet coil to minimize the inhomogeneity of said magnetic field, while minimizing axial forces between said coils;

at least some of said coil forms include support means in the form of a T-shaped opening coil receiving pocket with a first portion of said F-shaped pocket extending in a radial direction from said axial bore and a second connected portion of said T-shaped opening extending in an axial direction.

6. The superconducting magnet of claim 5 wherein said coil form is FRP.

7. The superconducting magnet of claim 5 wherein said radially spaced main magnet and correction coils are layered on said coil form whereby axial magnetic forces therebetween are minimized.

8. The superconducting magnet of claim 7 wherein said coils are radially superimposed about said axis with said main magnet coil extending axially a greater distance than said correction coil.

9. The superconducting magnet of claim 8 wherein said main magnet coils extend axially in the range of 1 to 1.5 times the axial length of said correction coils.

10. The superconducting magnet of claim 9 wherein said main magnet and said correction coils are contiguous to said imaging bore.

11. The superconducting magnet of claim 10 wherein there are approximately six of said coil support forms equally axially spaced along said axis.

* * * * *